United States Patent [19]
Samukawa

[11] Patent Number: 5,827,435
[45] Date of Patent: Oct. 27, 1998

[54] PLASMA PROCESSING METHOD AND EQUIPMENT USED THEREFOR

[75] Inventor: Seiji Samukawa, Tokyo, Japan

[73] Assignee: NEC Corporation, Tokyo, Japan

[21] Appl. No.: 548,730

[22] Filed: Oct. 26, 1995

[30] Foreign Application Priority Data

Oct. 27, 1994 [JP] Japan .................................. 6-263763
May 15, 1995 [JP] Japan .................................. 7-115655

[51] Int. Cl.$^6$ .......................... H01L 21/302; H01L 21/31
[52] U.S. Cl. .................. 216/69; 156/345; 118/723 MW; 315/111.21; 216/71
[58] Field of Search ............... 156/643.1, 345; 118/723 MW, 723 ME; 315/111.21; 204/298.38; 216/69, 71, 68

[56] References Cited

U.S. PATENT DOCUMENTS

| | | | |
|---|---|---|---|
| 4,401,054 | 8/1983 | Matsuo et al. | 118/723 |
| 4,559,100 | 12/1985 | Ninomiya et al. | 156/345 |
| 4,891,118 | 1/1990 | Ooiwa et al. | 204/298 |
| 5,231,057 | 7/1993 | Doki et al. | 437/225 |
| 5,310,452 | 5/1994 | Doki et al. | 156/643 |
| 5,395,453 | 3/1995 | Noda | 118/723 R |
| 5,468,341 | 11/1995 | Samukawa | 156/643 |

FOREIGN PATENT DOCUMENTS

| | | |
|---|---|---|
| 56-155535 | 12/1981 | Japan . |
| 60-134423 | 7/1985 | Japan . |
| 04103783 | 4/1992 | Japan . |
| 04232261 | 8/1992 | Japan . |

*Primary Examiner*—R. Bruce Breneman
*Assistant Examiner*—George Goudreau
*Attorney, Agent, or Firm*—Sughrue,Mion,Zinn,Macpeak & Seas, PLLC

[57] ABSTRACT

A plasma processing method is provided which suppresses the charge accumulation on a processing object such as a semiconductor substrate. An alternating excitation signal in the form of pulses for exciting the plasma is supplied to a reaction gas contained in a plasma chamber, each pulse having an on-period $t_{on}$ for supplying the excitation signal and an off-period $t_{off}$ for stopping the excitation signal. The off period ranges from 10 to 100 μsec. The on-period may be determined as needed. An alternating bias signal for biasing the processing object is also applied to the object in the chamber. The bias signal has a frequency of at most 600 kHz. As a result, an increased number of positive and negative ions impinge the object thus increasing the processing rate and reducing the charge accumulation compared to prior art processes.

16 Claims, 7 Drawing Sheets

PLASMA PROCESSING METHOD AND EQUIPMENT USED THEREFOR

BACKGROUND OF THE INVENTION

1. Field of the Invention

The present invention relates to plasma processing and more particularly, to a plasma processing method that processes a surface of an object such as a semiconductor substrate using a plasma excited by a high-frequency electric field such as a microwave, and plasma processing equipment used for the method.

2. Description of the Prior Art

A conventional microwave plasma etching, apparatus is schematically shown in FIG. 1. Such equipment is disclosed, for example, in Japanese Non-Examined Patent Publication Nos. 56-155535, 60-134423 and 4-103783.

As shown in FIG. 1, this conventional equipment has a discharge room 601 in which a plasma 609 is created and a reaction chamber 602 in which etching is performed on a semiconductor substrate 614. The substrate 614 is placed on a substrate holder 610 that is fixed in the reaction chamber 602 during the etching process. The reaction chamber 602 is connected to the bottom periphery of the discharge room 601.

A microwave waveguide 605 is connected to the discharge room 601. The end of the waveguide 605 is fixed onto the bottom periphery of the discharge room 601 so that the waveguide 605 takes the room 601 therein. An introduction window 604 through which a microwave 608 is introduced into the discharge room 601 is fixed in the waveguide 605 near its end.

A solenoid or magnet coil 603 is provided outside the discharge room 601 and the reaction chamber 602 surrounding the discharge room 601. This coil 603 generates a magnetic field either to confine the plasma 609 within a specified range of the discharge room 601 or to cause an electric cyclotron resonance (ECR) discharge in the discharge room 601 in cooperation with the introduced microwave 608.

A reaction gas is introduced into the reaction chamber 602 through a gas inlet 607 of the chamber 602. The gas in the chamber 602 is pumped away through gas outlets 606 of the chamber 602.

When the substrate 614 is etched, the substrate 614 is placed on the holder 610 and then, a microwave 608 is generated by a microwave source (not shown) such as a magnetron and is transmitted through the waveguide 605 to be introduced into the discharge room 601 through the window 604.

An rf substrate bias voltage whose frequency ranges from 800 kHz to 13.56 MHz is produced by a power supply 612. The rf substrate bias voltage thus produced is applied to the substrate 614 through the substrate holder 610. A blocking capacitor 611 is provided between the power supply 612 and the holder 610 in order to dc isolate the holder 610 from ground.

During the etching process, the substrate 614 is anisotropically etched by active ions generated in the plasma 609. When employing the ECR discharge, the plasma 609 is enhanced by the ECR discharge due to the interaction of the microwave 608 and the magnetic field, increasing the generate etch rate of the substrate 614.

With the conventional microwave plasma etching method using the equipment of FIG. 1, negative charges, i.e., electrons, tend to be accumulated on the substrate 614 during the etching process. These accumulated electrons generate a negative self-bias voltage on the substrate 614, preventing the active, negative ions and the electrons generated in the plasma 609 from impinging on the substrate 614. Consequently, the obtainable etch rate is low.

Specifically, as shown in FIG. 2, the peak-to-peak voltage of the rf substrate bias voltage is $V_0$, the substrate self-bias voltage caused by the accumulated electrons is $V_{gt}$, and the plasma potential is $V_p$ with respect to the self-bias voltage $V_{gt}$. The character $V_1$ indicates the difference between the top peak of the substrate bias voltage and the self-bias voltage $V_{gt}$ and the character $V_2$ indicates the difference between the bottom peak of the substrate bias voltage and the self-bias voltage $V_{gt}$, where $V_1+V_2=V_0$.

As seen from FIG. 2, the electrons in the plasma 609 impinge on the substrates 614 within a very narrow or short range A, i.e. in which the voltage value is higher than $(V_{gt}+V_p)$. On the other hand, the positive ions in the plasma 609 impinge on the substrate 614 within a very wide or long range B in which the voltage value is lower than $(V_{gt}+V_p)$.

Therefore, with the conventional plasma etching method, almost all the etching action to the substrate 614 is done by only the positive ions, which leads to a low etch rate.

Additionally, although an rf substrate bias voltage whose frequency ranges from 800 kHz to 13.56 MHz is used in the above conventional method, the rf substrate bias voltage may be 100 to 600 kHz. This method is disclosed, for example, in the Japanese Non-Examined Patent Publication No. 4-103783. In this method, plasma is enhanced by the ECR discharge using a magnetic field. This method enables the realization of anisotropic etching with a high etch rate because of the ECR discharge.

SUMMARY OF THE INVENTION

Accordingly, an object of the present invention is to provide a plasma processing method that suppresses charge accumulation on a processing object or specimen.

Another object of the present invention is to provide a plasma processing method that both improves the processing rate and reduces radiation damage to a processing object.

Still another object of the present invention is to provide a plasma processing method with improved processing precision.

A further object of the present invention is to provide plasma processing equipment that can be used for the method of the present invention.

According to a first aspect of the present invention, a plasma processing method is provided in which an alternating excitation signal for exciting plasma is supplied to a reaction gas contained in a plasma chamber as pulses, each of which has an on-period ($t_{on}$) for supplying the excitation signal and an off-period ($t_{off}$) for stopping the excitation signal. The off-period ranges from 10 μsec to 100 μsec. The on-period may be determined as needed. The frequency of the excitation signal also may be determined as needed.

If the off-period is less than 10 μsec, the quantity or number of the generated negative ions is not high enough. If the off-period is more than 100 μsec, the quantity or number of the generated negative ions decreases.

Further, an alternating bias signal for biasing a processing object is applied to the object placed in the plasma. The bias signal has a frequency of at most 600 kHz.

If the frequency is more than 600 kHz, the positive and negative ions cannot follow the change of the alternating bias signal.

In the plasma processing method according to the first aspect of the invention, the alternating excitation signal is supplied to the processing object in the form of pulses, each of which has an off-period ranging from 10 $\mu$sec to 100 $\mu$sec. Therefore, the density of generated negative ions in the excited plasma is overwhelmingly greater than in the case of the continuous, alternating excitation signal resulting in a continuous discharge. This is due to the fact that a large quantity of negative ions are temporarily generated in the plasma during the off-period of 10 to 100 $\mu$sec after its prior on-period. The lifetime of the generated negative ions after the glow discharge is in the range of 10 to 100 $\mu$sec.

Also, since the alternating bias signal has a frequency of 600 kHz or less, the generated negative and positive ions, each of which is heavier than an electron, can follow the change of the applied, alternating bias signal. Therefore, the positive ions and the negative ions can be alternately accelerated by the alternating bias signal toward the processing object to impinge on the object during every half cycle.

Consequently, no negative charges or electrons are accumulated on the object, which means that the charge accumulation effect occurring on the processing object can be suppressed.

In addition, because not only the positive ions but also the negative ions alternately affect the processing object synchronous with the alternating bias signal, processing rate of the object can be increased.

Further, both the positive ions and the negative ions affect the processing action and therefore, the object suffers less radiation damage and/or less unwanted processing action due to the motion difference between the relatively heavy positive and negative ions and the relatively light electrons. This leads to improved processing precision. Such radiation damage and unwanted processing tend to remarkably occur in a plasma process enhanced by a magnetic field.

In the method according to the first aspect, of the present invention the duty ratio of each pulse of the alternating excitation signal is preferably equal to 10% or less. The duty ratio is defined as a ratio of the on-period to the off-period, i.e., ($t_{on}/t_{off}$).

A preferable frequency range of the alternating bias signal is from 100 to 600 kHz, because some charges are accumulated on the object if it is less than 100 kHz.

In a preferred embodiment, the alternating bias signal is applied to the processing object in the form of pulses that are synchronous with the pulses of the supplied alternating excitation signal. The advantage is that more precision processing can be obtained because the applied period of the bias signal to the object can be controlled.

In this case, it is preferable that the bias signal in the form of pulses be applied only during the off-periods ($t_{off}$) of the excitation signal. The advantage is that only the positive and negative ions strike the object, so the charge accumulation effect onto the object can be almost completely suppressed.

The method according to the first aspect of the invention may be applied to any processing fields or applications. For example, it may be applied to any etching process such as reactive ion etching (RIE) or the like. It may be applied to any deposition process such as sputtering or the like.

According to a second aspect of the present invention, plasma processing equipment is provided, which comprises a plasma chamber in which plasma is generated, a plasma excitation signal source for supplying an alternating excitation signal to the chamber, a gas source for supplying a reaction gas to the chamber, a gas removing system for removing the gas contained in the chamber, an object holder for holding the object thereon in the chamber, and a bias signal source for supplying an alternating bias signal to the object placed on the holder.

The alternating excitation signal is supplied in the form of pulses, each of which has an on-period for supplying the excitation signal and an off-period for stopping the excitation signal. The off-period ranges from 10 to 100 $\mu$sec. The alternating bias signal has a frequency of at most 600 kHz.

Using the plasma processing equipment according to the second aspect of the invention, the plasma processing method according to the first aspect can be performed.

DETAILED DESCRIPTION OF THE PREFERRED EMBODIMENTS

Figure 1:
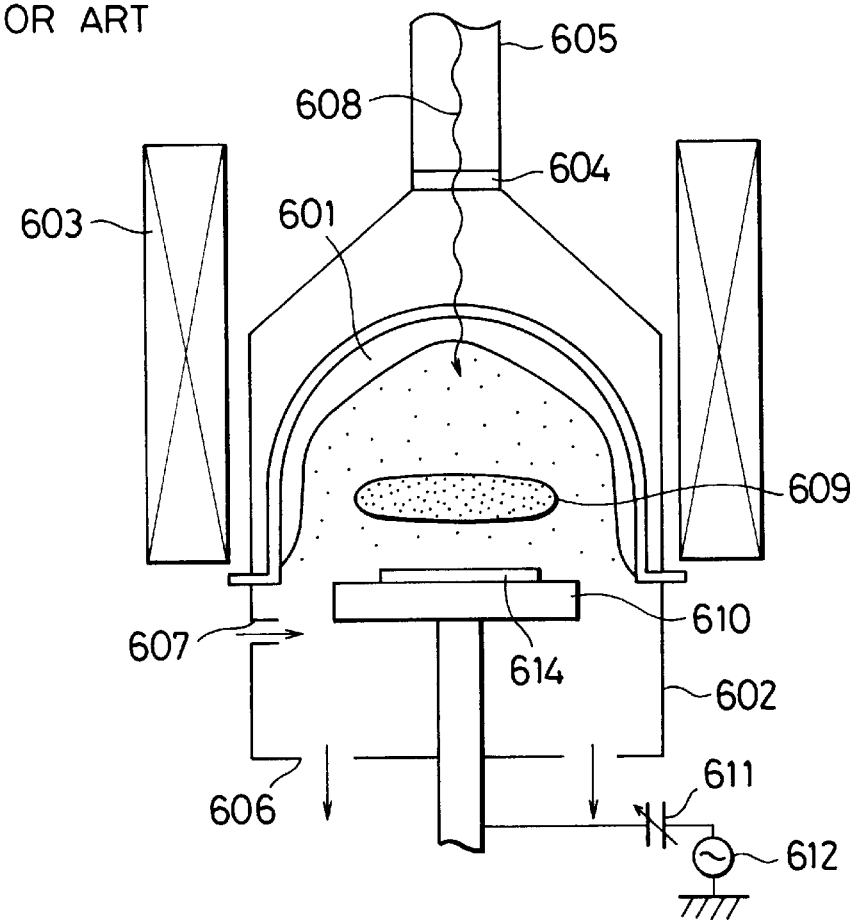
FIG. 1 is a schematic cross-sectional view of a conventional microwave plasma etching apparatus.
Figure 2:
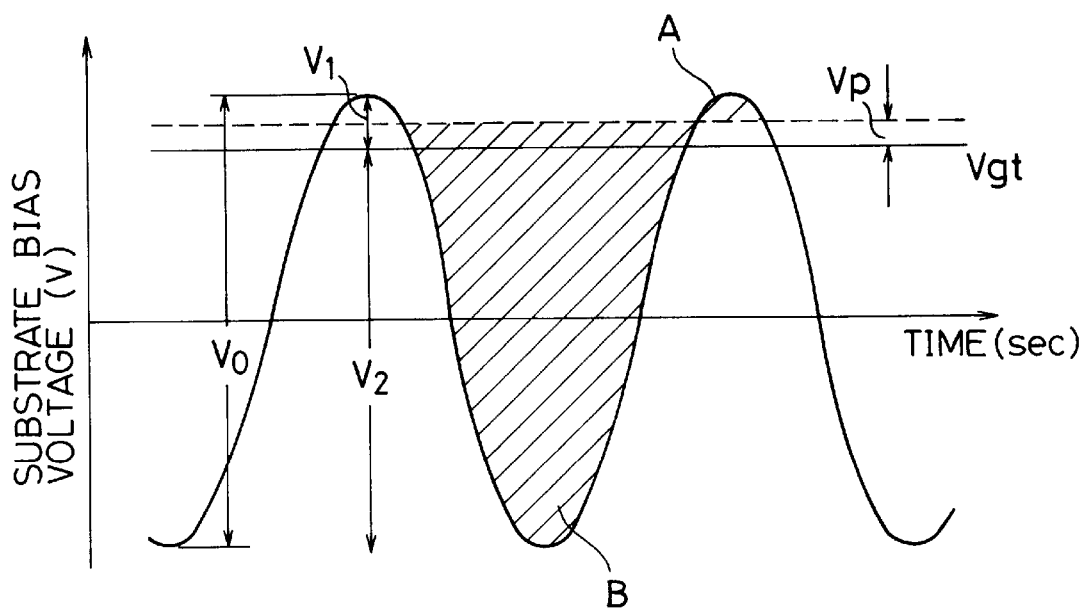
FIG. 2 shows the relationship of the time-dependent change of an rf substrate bias voltage with the substrate self-bias voltage and the plasma potential.

Preferred embodiments of the present invention will be described below while referring to the drawings.

FIRST EMBODIMENT

Figure 3:
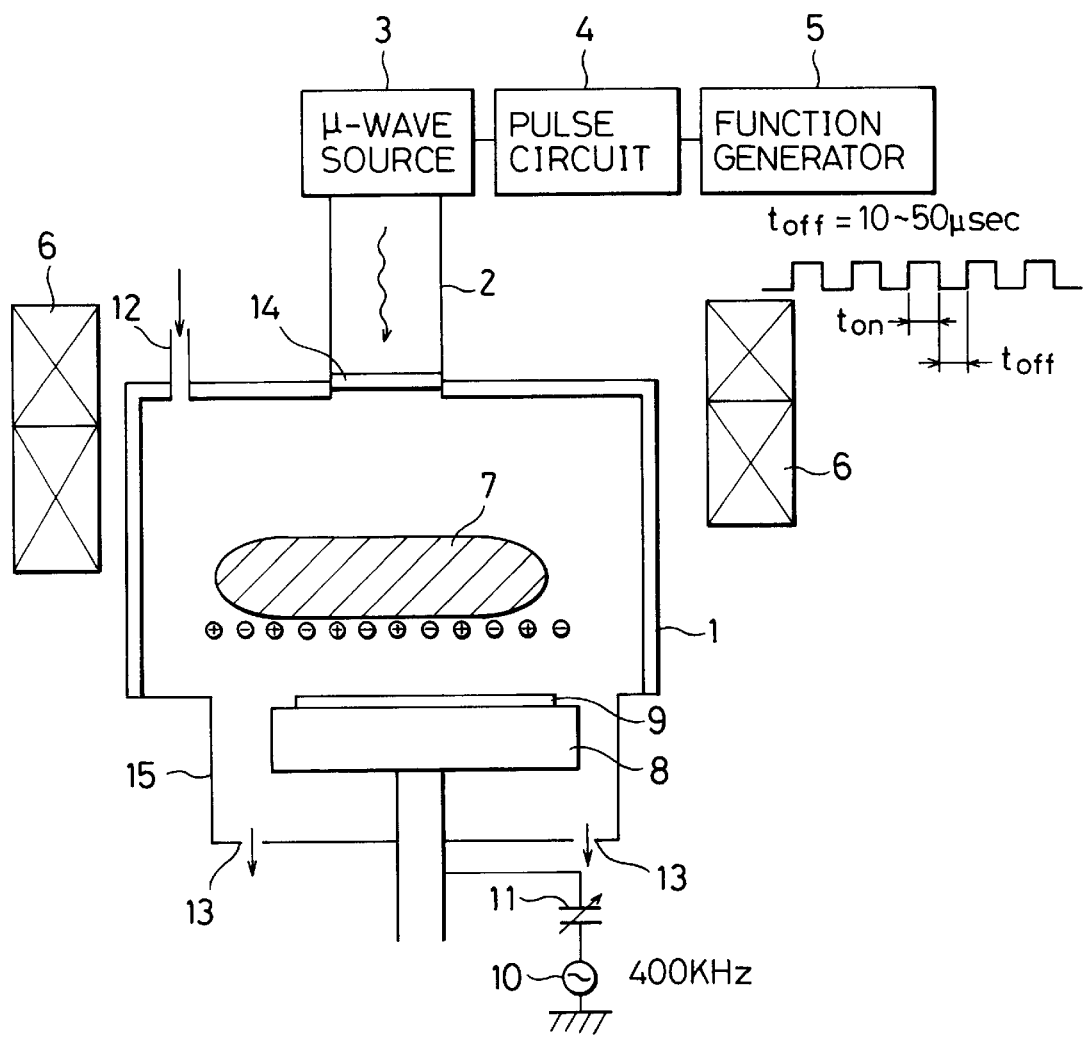
FIG. 3 is a schematic cross-sectional view of a microwave plasma etching apparatus according to an embodiment of the invention.

A microwave plasma etching equipment according to a first embodiment of the invention has the structure shown in FIG. 3.

In FIG. 3, a plasma chamber 1 in which plasma is generated and a reaction chamber 15 in which an etching is performed provided. The two chambers 1 and 15 are communicate with each other. A substrate loading room (not shown) is provided near the plasma chamber 1.

An end of a microwave waveguide 2 is connected to the top of the plasma chamber 1. The other end thereof is connected to a microwave source 3 such as a magnetron. A pulse circuit 4 is connected to the microwave source 3. A function generator 5 is connected to the pulse circuit 4.

The function generator 5 generates various functions. The pulse circuit 4 receives the functions generated in the generator 5 and produces various types of repeated pulses according to the functions thus received. The microwave source 3 receives the various types of repeated pulses and produces microwaves having various, specified frequencies in the form of repeated pulses.

A selected one of the various pulse types is sent to the microwave source 3. Then, the source 3 produces a microwave and pulse-modulates the microwave thus produced according to the selected pulse type. The microwave is transmitted through the waveguide 2 to the plasma chamber 1. An introduction window 14 is fixed at the end of the waveguide 2. The microwave enters the discharge room 601 through the window 14.

Here, the microwave produced by the source 3 has a specified frequency such as 2.45 GHz, and is pulse-modulated, i.e., supplied in the form of pulses to the chamber 1. As shown in FIG. 3, each pulse of this microwave has an "on-period" $t_{on}$ in which the microwave is supplied and an "off-period" $t_{off}$ in which the microwave is not supplied or stopped. During the on-period $t_{on}$, the microwave has a constant amplitude.

A solenoid or magnet coil 6 is provided outside the plasma chamber 1. This coil 6 generates a magnetic field either to confine the plasma within a specified range of the chamber 1 or to cause an electric cyclotron resonance (ECR) discharge in the chamber 1 in cooperation with the introduced microwave.

A reaction gas is introduced into the plasma chamber 1 through a gas inlet 12 formed in the top wall of the chamber 1 by a gas supply system (not shown). The reaction gas supplied in the chamber 1 is pumped away through gas outlets 13 formed in the bottom wall of the chamber 15 by a gas pumping system (not shown).

A substrate holder 8 is provided in the reaction chamber 15. A semiconductor substrate 9 as an etching object is placed on the holder 8, as shown in FIG. 3.

An alternating current (ac) power supply 10 is provided to apply an rf substrate bias voltage to the substrate 9. The power supply 10 is electrically connected to the substrate holder 8 through a variable blocking capacitor 11 to dc isolate the holder 8 from ground. The substrate rf bias voltage is applied to the substrate 9 through the holder 8.

A microwave plasma etching method according to a first embodiment of the invention is described below. This method is performed using the above equipment.

First, the semiconductor substrate 9 such as a silicon substrate is placed on the holder 8 in the plasma chamber 1. As the reaction gas, oxygen ($O_2$) or nitrogen ($N_2$) is supplied into the chamber 1 through the gas inlet 12. The gas is supplied at the a specific flow rate during the etching process. On the gas is kept to pumped away through the gas outlets 13 throughout the etching process.

The pressure of the reaction gas is 0.47 Pa (=0.03525 mTorr) and the flow rate thereof is 30 standard cubic centimeters per minute (sccm).

Then, as an alternating excitation signal for plasma excitation, a microwave having a frequency of 2.45 GHz generated by the microwave source 3 is introduced into the plasma chamber 1 in the form of repeated pulses. Each pulse of this microwave has an off-period in the range from 10 to 50 $\mu$sec. The length of each on-period is optionally determined.

Simultaneously with the microwave application, as an alternating bias signal, an rf substrate bias voltage whose frequency is 400 kHz and whose power is 0.90 kW, which is produced by the power supply 10, is applied to the substrate 9 through the holder 8.

In the method according to the first embodiment, the pulsed microwave causes plasma 7 to be produced in the chamber 1, and a lot of negative ions and positive ions are temporarily generated in the plasma 7 during the off-period $t_{off}$. Since the rf substrate bias voltage has a sufficiently low frequency of 400 kHz, the generated negative ions and positive ions can follow the change of the applied bias voltage, impinging on the substrate 9 during every half cycle. Accordingly, no negative charges are accumulated on the substrate 9.

Also, because both the positive and negative ions alternately affect the substrate 9 synchronous with the rf bias voltage, a higher etch rate can be obtained. Further, the substrate 9 suffers less radiation damage and less unwanted etching action, resulting in improved etching precision even if the magnetic field is applied to the reaction gas.

Figure 4:
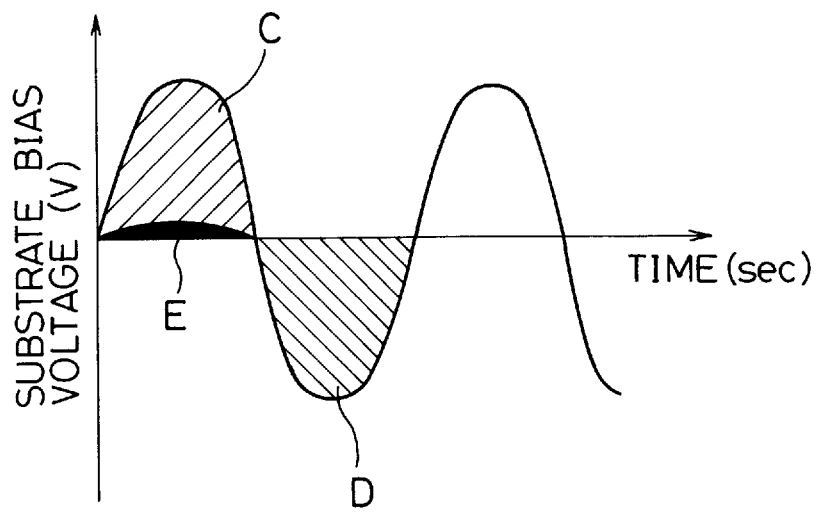
FIG. 4 shows the time-dependent change of an rf substrate bias voltage which is obtained by a plasma etching method according to a first embodiment of the invention.

FIG. 4 shows the relationship of the time-dependent change of the rf substrate bias voltage with the substrate self-bias voltage. In FIG. 4, the negative ions impinge the substrate 9 in the region C, the positive ions impinge the substrate 9 in the region D, and the electrons impinge the substrate 9 in the region E. It is seen from FIG. 4 that even the electrons serve the etching action of the substrate 9.

Figure 5:
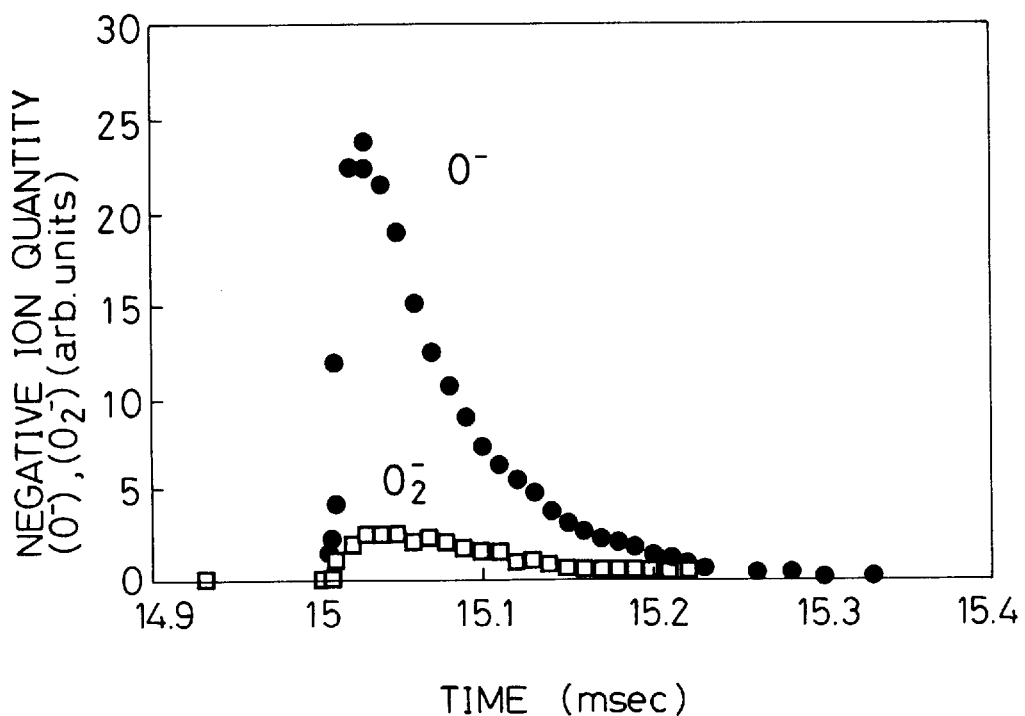
FIG. 5 is a graph showing the time-dependent change of the negative ion quantity which is obtained in the plasma etching method according to the first embodiment.

FIG. 5 shows the time-dependent change of the negative ions quantities of $O^-$ and $O_2^-$, which was obtained for an $O_2$ plasma by measuring the negative ion current. In FIG. 5, the applied microwave is stopped at the time of 15.0 msec. It is seen from FIG. 5 that the negative ions $O^-$ and $O_2^-$ are generated at the time several microseconds after the stop, and that the density becomes the most at the time of 30 $\mu$sec after the stop. Therefore, it is seen that the negative ions are generated efficiently by a microwave pulse whose off-period $t_{off}$ ranges from 10 to 50 $\mu$sec.

Figure 6:
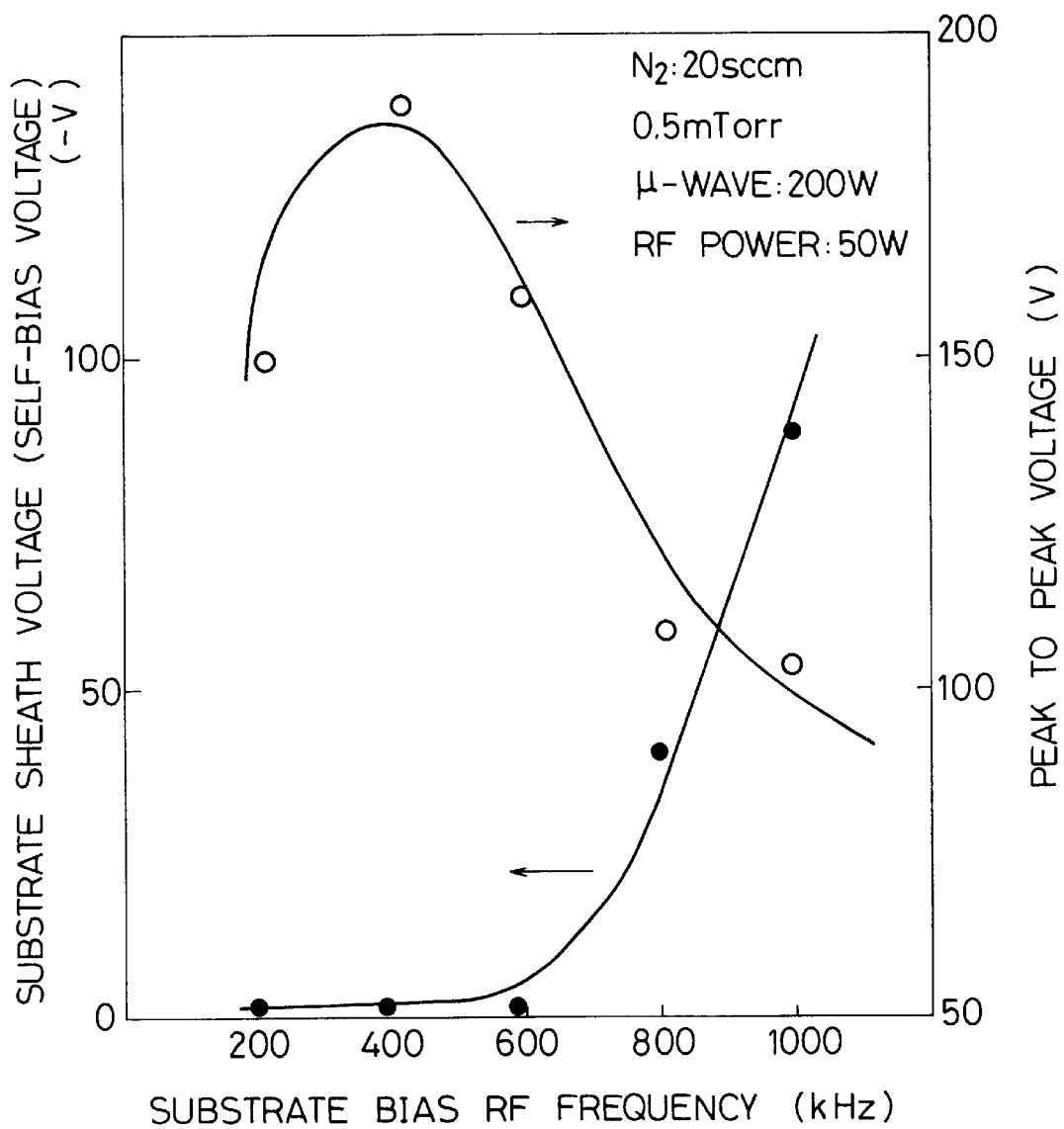
FIG. 6 is a graph showing the relationships of the substrate bias rf frequency with the substrate sheath voltage (self-bias voltage) and the peak-to-peak voltage of the substrate bias rf voltage, which is obtained in the plasma etching method according to the first embodiment.

FIG. 6 shows the relationship of the substrate bias rf frequency to the substrate sheath voltage (or, self-bias voltage) and the peak-to-peak voltage of the substrate bias rf voltage, which was obtained for an $N_2$ plasma for the frequency of 200 to 1000 kHz. The power of the substrate bias signal was 200 W, and the pressure and flow rate of the gas were 0.5 mTorr and 20 sccm.

It is seen from FIG. 6 that the substrate sheath voltage is almost zero when the substrate bias frequency is from 600 kHz to 200 kHz. This is caused by alternating impingement of the positive ions and electrons. In other words, FIG. 6 shows that the relatively heavy positive ions can follow the change of the substrate rf bias voltage similarly to the relatively light electrons when the substrate bias frequency is from 600 kHz to 200 kHz.

As a result, it is confirmed that the plasma excited by the pulsed microwave whose off-period is 10 to 50 $\mu$sec efficiently generates positive and negative ions, and that the generated positive and negative ions can impinge the substrate 9 efficiently by the low-frequency rf bias voltage to the substrate 9.

In the method of the first embodiment, the frequency of the microwave, i.e., the discharge frequency, can be optionally selected.

SECOND EMBODIMENT

In a microwave plasma etching method according to a second embodiment of the invention, chlorine ($Cl_2$) is used as the reaction gas. The pressure of the reaction gas is 3 mTorr and the flow rate thereof is 30 sccm.

The microwave has a frequency of 2.45 GHz in the form of repeated pulses, each of which has an off-period in the range from 10 to 100 μsec. The length of each on-period is optionally determined. The microwave power is 1 kW. The rf substrate bias voltage has a frequency of 600 kHz.

The other conditions are the same as those of the method according to the first embodiment.

Figure 7:
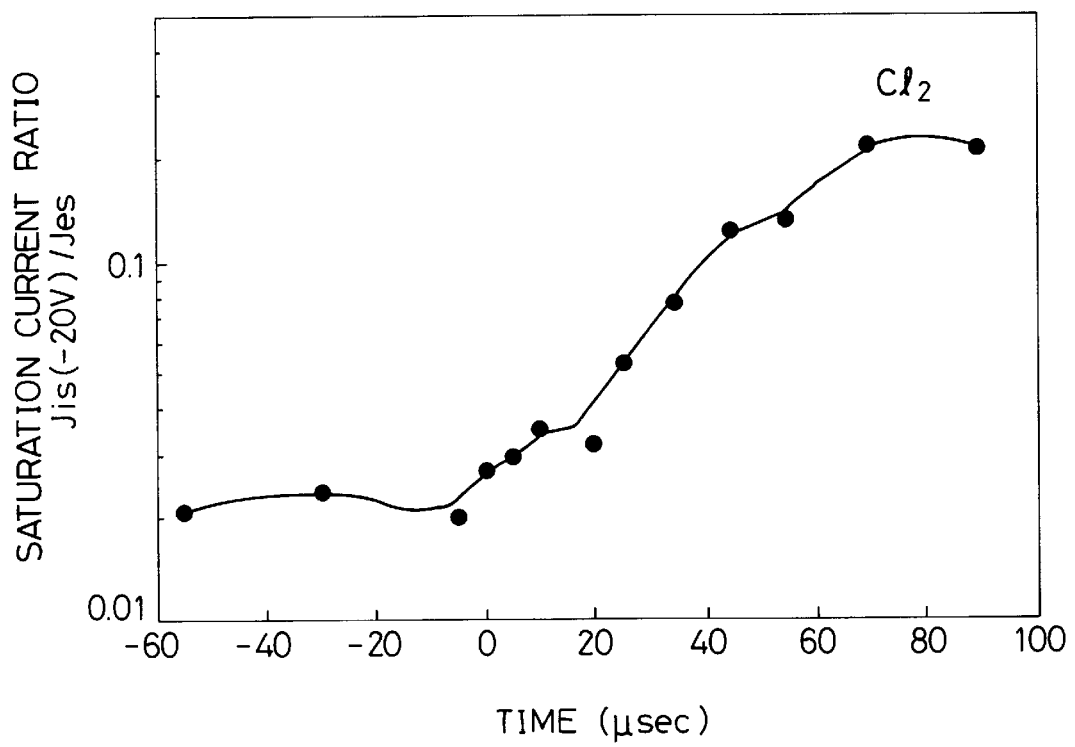
FIG. 7 is a graph showing the time-dependent change of the saturation current ratio ($j_{is}/j_{es}$) which is obtained in a plasma etching method according to a second embodiment of the invention.

FIG. 7 shows the time-dependent change of the saturation current ratio ($j_{is}/j_{es}$) in the $Cl_2$ plasma, in which the microwave was stopped at the time zero (0). It is seen from FIG. 7 that negative ions are generated and their density increases during a period of 100 μsec after the stop of the microwave.

Figure 8:
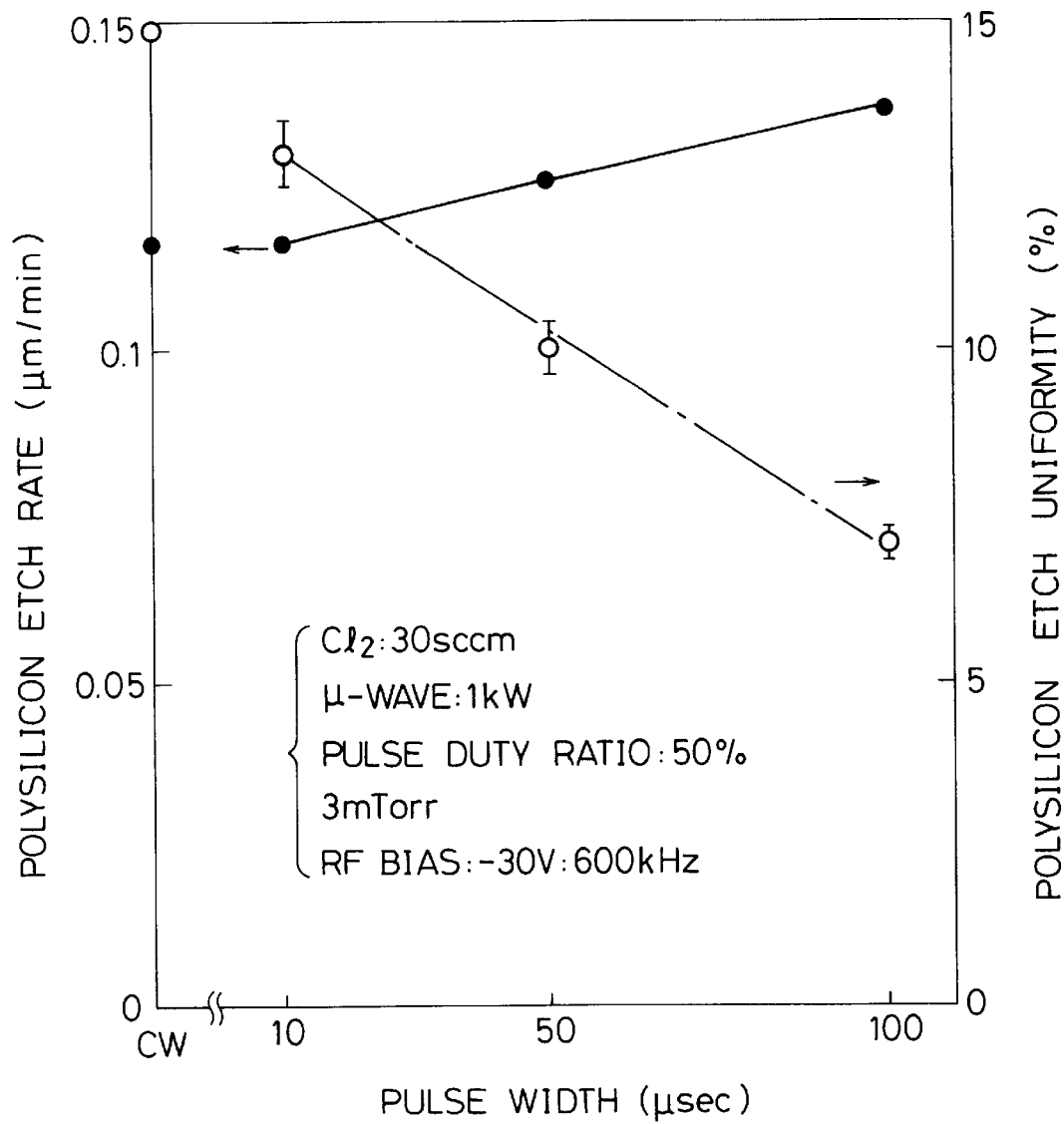
FIG. 8 is a graph showing the relationships of the polysilicon etch rate and polysilicon etch uniformity with the pulse width of the applied microwave, which is obtained in the plasma etching method according to the second embodiment of the invention.

FIG. 8 shows the relationships of the polysilicon etch rate and polysilicon etch uniformity with the pulse width of the applied microwave, in which an etching process was performed to a polysilicon film deposited on the silicon substrate 9. It is seen from FIG. 8 that the etch rate increases and the etch uniformity is improved within the period after the microwave is stopped up to 100 μsec. This is because the plasma potential is improved in uniformity by the generated negative ions and that the negative ions impinge onto the polysilicon film to affect its etching action. It is confirmed by FIG. 8 that the off-period $t_{off}$ of the pulsed microwave is effective in the range of 10 to 100 μsec.

THIRD EMBODIMENT

In a microwave plasma etching method according to a third embodiment, of the invention the etching conditions are the same as those of the second embodiment except the substrate bias voltage is applied to the substrate 9 in the form of repeated pulses that are synchronous with the pulses of the microwave.

Figure 9:
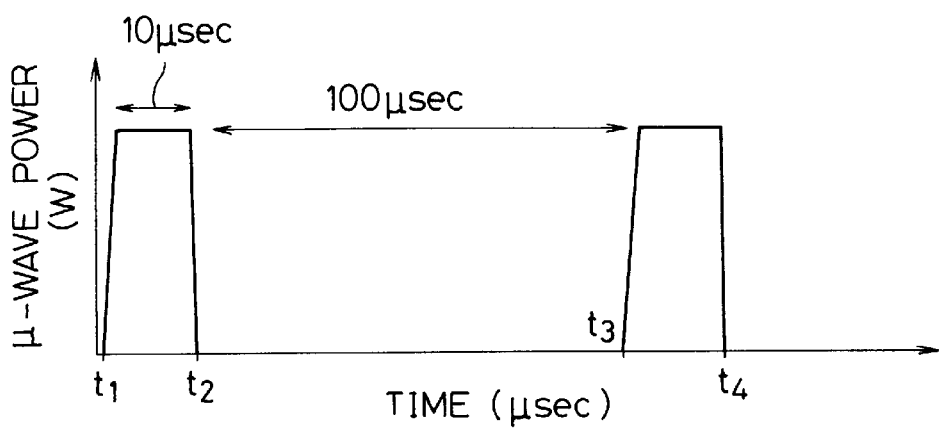
FIG. 9 is a timing chart showing the change of power of the applied microwave which is obtained in a plasma etching method according to a third embodiment of the invention.

A duty ratio of the pulsed microwave is defined as a ratio of the on-period to the off-period, i.e., ($t_{on}/t_{off}$). The duty ratio of the microwave is equal to 10% in this third embodiment, specifically the on-period $t_{off}$ is 10 μsec and the off-period $t_{off}$ is 100 μsec, as shown in FIG. 9. The on-periods start at the time of $t_1$ and $t_3$, and end at the time of $t_2$ and $t_4$.

Figure 10:
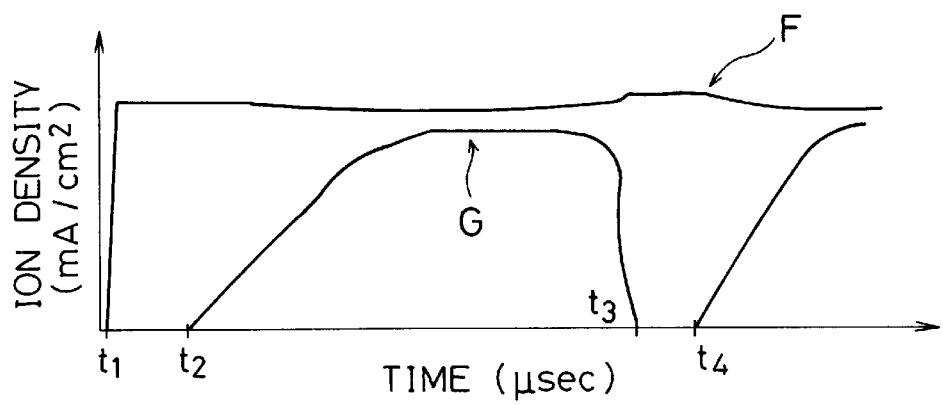
FIG. 10 is a timing chart showing the change of the generated ion density which is obtained in the method according to the third embodiment of the invention.

Referring to FIG. 10, the ion density of the generated positive ions is indicated by the curve F, and that of the negative ions by the curve G. It is seen from FIG. 10 that although the positive ion density indicates an almost constant value, the negative ion density starts to increase at the time of $t_2$ and decreases near at the time of $t_3$. In other words, the negative ions exist only during the off-period toff.

Figure 11:
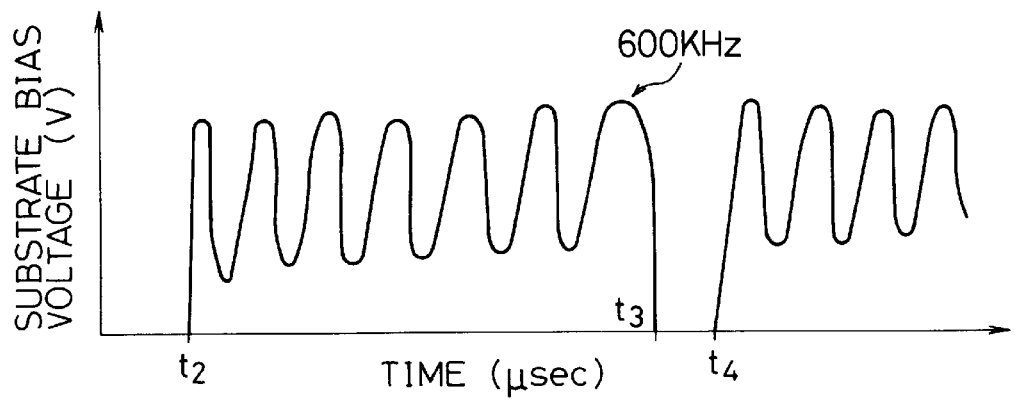
FIG. 11 is a timing chart showing the change of the substrate bias voltage which is obtained in the method according to the third embodiment.

The substrate bias voltage is applied to the substrate 9 in the form of pulses a synchronous with the microwave pulses, as shown in FIG. 11. In other words, the rf bias voltage of 600 kHz is applied to the substrate 9 only during the off-periods of the microwave.

The method according to the third embodiment is effective for ECR-enhanced plasma in which a sufficient density of positive ions can be obtained during a short period of about 10 μsec. The reason is that not only the positive ions but also a lot of negative ions are generated during the comparatively-long off-period $t_{off}$ of 100 μsec.

This is advantageous that only the positive and negative ions strike the substrate 9 so that the charge accumulation effect onto the substrate 9 can be almost completely suppressed.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. In plasma processing method for processing an object using a plasma, said method comprising the steps of:

supplying an alternating excitation signal for exciting said plasma to a reaction gas contained in a plasma chamber said excitation signal being in the form of pulses; and applying an alternating bias signal to said object placed in said chamber;

wherein each of said pulses of said excitation signal has an on-period for supplying said excitation signal and an off-period for stopping said excitation signal, said off-period ranging from 10 μsec to 100 μsec;

and wherein said bias signal has a frequency of at most 600 kHz.

2. A method as claimed in claim 1, wherein when a duty ratio of each pulse of said excitation signal is defined as ($t_{on}/t_{off}$) where $t_{on}$ on is said on-period and $t_{off}$ is said off-period, said duty ratio is equal to 10% or less.

3. A method as claimed in claim 1, wherein said bias signal has a frequency from 100 to 600 kHz.

4. A method as claimed in claim 1, wherein said bias signal is applied to said object in the form of pulses synchronous with said pulses of said supplied excitation signal.

5. A method as claimed in claim 1, wherein said bias signal is applied to said object in the form of pulses;

and wherein said bias signal is applied only during said off-periods of said excitation signal.

6. A method as claimed in claim 1, wherein said off-period of each pulse of said excitation signal ranges from 10 μsec to 50 μsec.

7. A method as claimed in claim 1, wherein said excitation is signal is a microwave.

8. A plasma processing method for processing an object using plasma, said method comprising the steps of:

placing an object on a holder provided in a plasma chamber;

supplying a reaction gas to said chamber;

supplying an alternating excitation signal for exciting said plasma to said reaction gas contained in said chamber said excitation signal being in the form of pulses, each of said pulses of said excitation signal having an on-period for supplying said excitation signal and an off-period for stopping said excitation signal, said off-period ranging from 10 μsec to 100 μsec; and applying an alternating bias signal to said object placed in said chamber, said bias signal having a frequency of at most 600 kHz;

wherein negative ions and positive ions are temporarily generated in said plasma during said off-period;

and wherein said generated negative ions and said positive ions follow the change of said applied, alternating bias signal, impinging on said object during every half cycle.

9. A method as claimed in claim 8, wherein when a duty ratio of each pulse of said excitation signal is defined as ($t_{on}/t_{off}$) where $t_{on}$ is said on-period and $t_{off}$ is said off-period, said duty ratio is equal to 10% or less.

10. A method as claimed in claim 8, wherein said bias signal has a frequency from 100 to 600 kHz.

11. A method as claimed in claim 8, wherein said bias signal is applied to said object in the form of pulses synchronous with said pulses of said supplied excitation signal.

12. A method as claimed in claim 8, wherein said bias signal is applied to said object in the form of pulses;

and wherein said bias signal is applied only during said off-periods of said excitation signal.

13. A method as claimed in claim 8, wherein said off-period of each pulse of said excitation signal ranges from 10 $\mu$sec to 50 $\mu$sec.

14. A method as claimed in claim 8, wherein said excitation signal is a microwave.

15. A plasma processing apparatus for processing an object using plasma, said apparatus comprising:

a plasma chamber in which said plasma is generated;

a plasma excitation signal source for supplying an excitation signal to said chamber, said alternating excitation signal being supplied in the form of pulses each of which has an on-period for supplying said excitation signal and an off-period for stopping said excitation signal;

a gas source for supplying a reaction gas to said chamber;

a gas removing system for removing said gas contained in said chamber;

an object holder for holding said object thereon in said chamber; and a bias signal source for supplying an bias signal to said object placed on said holder;

wherein said off-period of said excitation signal ranges from 10 $\mu$sec to 100 $\mu$sec, and said alternating bias signal has a frequency of at most 600 kHz.

16. An apparatus as claimed in claim 15, wherein said plasma excitation signal source is a microwave source.

* * * * *

UNITED STATES PATENT AND TRADEMARK OFFICE
CERTIFICATE OF CORRECTION

PATENT NO. : 5,827,435
DATED : October 27, 1998
INVENTOR(S) : Seiji Samukawa

It is certified that error appears in the above-identified patent and that said Letters Patent is hereby corrected as shown below:

Column 1, line 63, delete "gen-".

Column 1, line 64, delete "     erate".

Column 3, line 35, delete "remarkably".

Column 4, line 67, after "etching" insert --process--.

Column 5, line 1, after "performed" insert --are--.

Column 5, line 1, after "15" delete "are".

Column 5, line 64, delete "On the gas is kept to" and insert --The gas is also--.

Signed and Sealed this

First Day of June, 1999

Attest:

Q. TODD DICKINSON

Attesting Officer

Acting Commissioner of Patents and Trademarks